US012768871B2

(12) United States Patent
Shu et al.

(10) Patent No.: US 12,768,871 B2
(45) Date of Patent: Oct. 20, 2026

(54) LINE FAULT DETECTION METHOD, SYSTEM, DEVICE, AND COMPUTER-READABLE STORAGE MEDIUM

(71) Applicant: Kunming University of Science and Technology, Kunming (CN)

(72) Inventors: Hongchun Shu, Kunming (CN); Yue Dai, Kunming (CN); Yutao Tang, Kunming (CN); Daiwen Zhang, Kunming (CN); Yiming Han, Kunming (CN); Weijie Lou, Kunming (CN); Hongfang Zhao, Kunming (CN); Shunguang Lei, Kunming (CN)

( * ) Notice: Subject to any disclaimer, the term of this patent is extended or adjusted under 35 U.S.C. 154(b) by 137 days.

(21) Appl. No.: 18/900,752

(22) Filed: Sep. 29, 2024

(65) Prior Publication Data

US 2025/0208188 A1 Jun. 26, 2025

(30) Foreign Application Priority Data

Dec. 20, 2023 (CN) ........................ 202311754038.3

(51) Int. Cl.
*G01R 31/08* (2020.01)
*G01R 31/11* (2006.01)

(52) U.S. Cl.
CPC ............ *G01R 31/085* (2013.01); *G01R 31/11* (2013.01)

(58) Field of Classification Search
CPC ...... G01R 31/08; G01R 31/085; G01R 31/11; G01R 31/58
See application file for complete search history.

(56) References Cited

FOREIGN PATENT DOCUMENTS

| | | |
|---|---|---|
| CN | 105510770 A | 4/2016 |
| CN | 115902530 A | 4/2023 |

*Primary Examiner* — Steven L Yeninas

(57) ABSTRACT

The provided are a line fault detection method, system, equipment, and a computer-readable storage medium. The line fault detection method comprises the following steps: Inject a pulse signal into the grounding electrode line and acquire fault voltage traveling wave data responding to the fault point in the grounding electrode line based on the measuring spot; Based on the fault voltage traveling wave data and a preset step size, determine the voltage forward traveling wave sequence and voltage reverse traveling wave sequence for the entire grounding electrode line; Based on the corresponding energy superposition expressions of the voltage forward traveling wave sequence and the voltage reverse traveling wave sequence, determine the integral value sequence of the traveling wave product within a preset time period; Based on the maximum mutation point in the integral value sequence, determine the fault distance.

4 Claims, 7 Drawing Sheets

LINE FAULT DETECTION METHOD, SYSTEM, DEVICE, AND COMPUTER-READABLE STORAGE MEDIUM

CROSS-REFERENCE TO THE RELATED APPLICATIONS

This application is based upon and claims priority to Chinese Patent Application No. 202311754038.3, filed on Dec. 20, 2023, the entire contents of which are incorporated herein by reference.

TECHNICAL FIELD

This invention pertains to the field of protective relaying for electrical circuit systems, specifically focusing on line fault detection methods, systems, equipment, and computer-readable storage media.

BACKGROUND

The grounding electrode lines of high-voltage direct current (HVDC) transmission systems operate at very low voltages, and the grounding electrodes are generally grounded through resistors with very low resistance values. Therefore, when a fault occurs in the grounding electrode line, the signal amplitude generated in the fault area is very small, making it difficult to accurately locate the position of the fault area. The currently adopted fault detection method typically involves injecting a pulse signal at the head end of the grounding electrode and analyzing the response of the pulse signal at the fault point to achieve fault location. However, traditional methods of signal processing and calculation are prone to be influenced by factors such as the transition resistance and line length, resulting in significant errors in distance measurement and positioning, which ultimately leads to inaccurate results in locating the fault area of the grounding electrode line.

The above content is solely used to assist in understanding the technical solution of the present invention and does not represent an admission that the content is existing technology.

SUMMARY

The main objective of this invention is to provide a line fault detection method, equipment, system, and computer-readable storage medium, aiming to address the technical problem of existing methods of signal processing and calculation being prone to being influenced by factors such as transition resistance and line length, resulting in significant errors in distance measurement and positioning, which ultimately leads to inaccurate results in locating the fault area of the grounding electrode line.

To achieve the above objective, the present invention provides a line fault detection method, which includes the following steps:

Inject a pulse signal into the grounding electrode line and acquire fault voltage traveling wave data responding to the fault point in the grounding electrode line based on the measuring spot;

Based on the fault voltage traveling wave data and a preset step size, determine the voltage forward traveling wave sequence and voltage reverse traveling wave sequence for the entire grounding electrode line;

Based on the corresponding energy superposition expressions of the voltage forward traveling wave sequence and the voltage reverse traveling wave sequence, determine the integral value sequence of the traveling wave product within a preset time period;

Based on the maximum mutation point in the integral value sequence, determine the fault distance.

Optionally, the step of determining the forward voltage traveling wave sequence and the reverse voltage traveling wave sequence along the entire grounding electrode line based on the fault voltage traveling wave data and the preset step size includes:

Perform mode conversion on the voltage traveling wave data to obtain the line mode voltage traveling wave component of the grounding electrode line;

Based on the preset step size and the line mode voltage traveling wave component, determine the voltage and current distribution along the grounding electrode line at any moment;

Determine the forward voltage traveling wave sequence and the reverse voltage traveling wave sequence based on the voltage and current distribution and the line mode wave impedance of the grounding electrode line.

Optionally, the step of determining the sequence of integral values of the product of traveling waves within a preset time period based on the energy superposition expressions corresponding to the forward voltage traveling wave sequence and the reverse voltage traveling wave sequence includes:

Obtaining the first numerical change gradient and the second numerical change gradient corresponding to the forward voltage traveling wave sequence and the reverse voltage traveling wave sequence, respectively;

Determining the forward voltage traveling wave energy superposition expression and the negative voltage energy superposition traveling wave expression based on the first numerical change gradient, the second numerical change gradient, the traveling wave velocity, the line length of the grounding electrode line, the sampling frequency, and the preset step size, respectively;

Performing a multiplication operation on the forward voltage traveling wave energy expression and the reverse voltage traveling wave energy expression to determine the integral value of the preset time period within the entire range of the grounding electrode line;

Mapping the integral values to the distance dimension to obtain the integral value sequence.

Optionally, before obtaining the first numerical change gradient and the second numerical change gradient corresponding to the forward voltage traveling wave sequence and the reverse voltage traveling wave sequence, respectively, the method further includes:

Calculating the numerical change gradient corresponding to the forward voltage traveling wave sequence and the reverse voltage traveling wave sequence based on a preset time interval, the forward voltage traveling wave sequence, and the reverse voltage traveling wave sequence.

Optionally, the step of determining the forward voltage traveling wave energy superposition expression and the reverse voltage traveling wave energy superposition expression based on the first numerical change gradient, the second numerical change gradient, the traveling wave velocity, the line length of the grounding electrode line, the sampling frequency, and the preset step size includes:

Based on the first numerical change gradient, the second numerical change gradient, the traveling wave velocity, the line length of the grounding electrode line, the sampling frequency, and the preset step size, determining an initial forward voltage traveling wave energy superposition expression corresponding to the first numerical change gradient and an initial reverse voltage traveling wave energy superposition expression corresponding to the second numerical change gradient;

Based on the initial forward voltage traveling wave energy superposition expression and the initial reverse voltage traveling wave energy expression, the forward voltage traveling wave energy superposition expression and the reverse voltage traveling wave energy superposition expression are determined, respectively.

Optionally, the initial forward voltage traveling wave energy superposition expression represents the superposition expression of forward voltage traveling wave energy at any point and any time in the grounding electrode line, while the initial reverse voltage traveling wave energy superposition expression represents the superposition expression of reverse voltage traveling wave energy at any point and any time in the grounding electrode line.

Optionally, the step of determining the fault distance based on the maximum mutation point in the integral value sequence includes:

Marking the maximum mutation point in the integral value sequence;

Calculating the superimposed value of the change gradient of the integral value sequence before the maximum mutation point;

If the superimposed value is negative, the fault distance is the distance corresponding to the maximum mutation point;

If the superimposed value is positive, the fault distance is the difference between the line length of the grounding electrode line and the distance corresponding to the maximum mutation point.

In addition, to achieve the above objectives, the present invention also provides a line fault detection system, which includes:

Pulse Signal Generation Module: configured to inject a pulse signal into a grounding electrode line and acquire fault voltage traveling wave data responding to a fault point in the grounding electrode line based on a measuring spot;

Electrical Signal Sequence Acquisition Module: configured to determine a forward voltage traveling wave sequence and a reverse voltage traveling wave sequence for the entire grounding electrode line based on the fault voltage traveling wave data and a preset step size;

Numerical Calculation Module: configured to determine an integral value sequence of traveling wave products within a preset time period based on energy superposition expressions corresponding to the forward voltage traveling wave sequence and the reverse voltage traveling wave sequence;

Fault Location Module: configured to determine a fault distance based on the maximum mutation point in the integral value sequence.

Furthermore, to achieve the above objectives, the present invention also provides a line fault detection device, which includes a memory, a processor, and a line fault detection program stored on the memory and executable on the processor. The line fault detection program is configured to implement the steps of the aforementioned line fault detection method.

Additionally, to achieve the above objectives, the present invention also provides a computer-readable storage medium on which a line fault detection program is stored. When the line fault detection program is executed by a processor, it implements the steps of the aforementioned line fault detection method.

Embodiments of the present invention provide a line fault detection method that involves injecting a pulse signal into a grounding electrode line, acquiring fault voltage traveling wave data based on the pulse signal response at a fault point in the grounding electrode line from a measuring spot, determining forward voltage traveling wave sequences and reverse voltage traveling wave sequences for the entire grounding electrode line based on the fault voltage traveling wave data and a preset step size, subsequently determining an integral value sequence of traveling wave products within a preset time period based on energy superposition expressions corresponding to the forward voltage traveling wave sequences and the reverse voltage traveling wave sequences, and finally determining the fault distance in the grounding electrode line based on the maximum mutation point in the integral value sequence. Through this method, the fault localization accuracy of the grounding electrode line can be improved.

Figure 1:
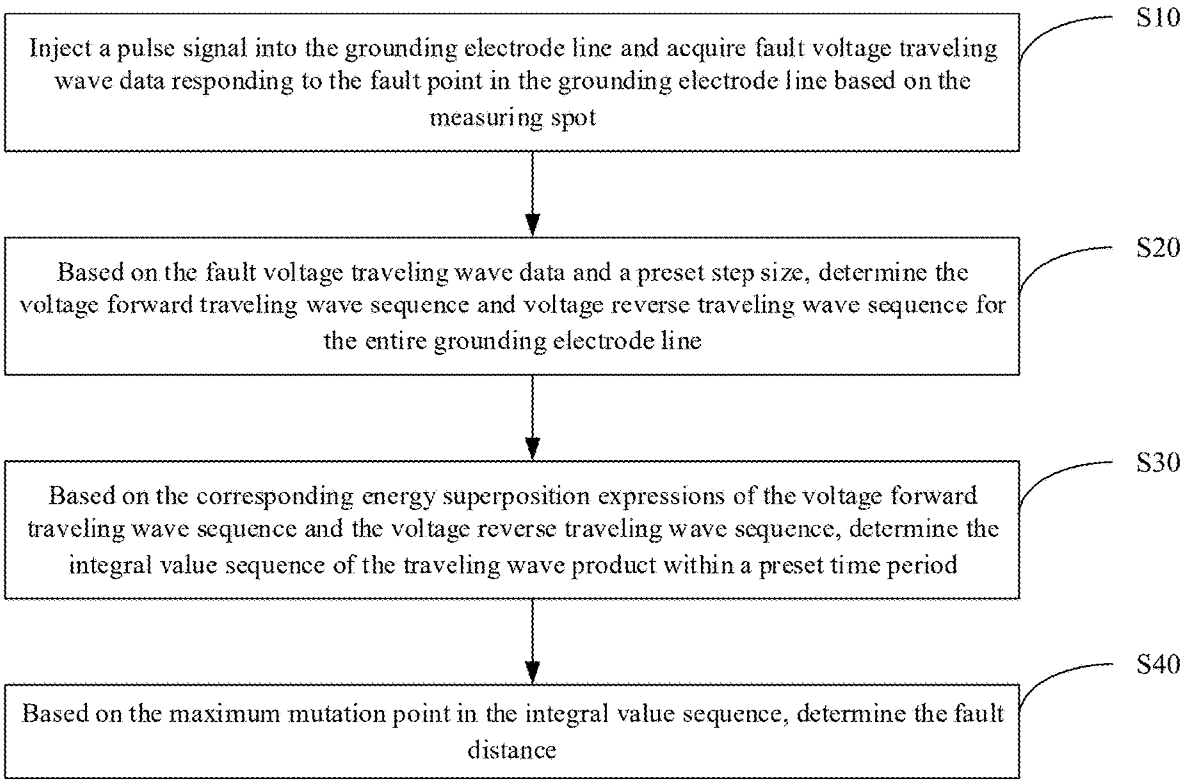
FIG. 1 is a flowchart illustrating the first embodiment of the line fault detection method of the present invention.

The realization of the objectives, functional characteristics, and advantages of the present invention will be further explained with reference to the embodiments and drawings.

DETAILED DESCRIPTION OF THE EMBODIMENTS

High-voltage direct current (HVDC) transmission plays a crucial role in large-scale energy transmission from west to east in China due to its advantages of long transmission distance and large transmission capacity. The grounding electrode line is an indispensable and important component of the HVDC transmission system. The grounding electrode line in the HVDC transmission system not only provides a loop for the direct current but also reduces system losses by utilizing the grounding electrode-ground return path during single-pole operation. Moreover, it plays a significant role in clamping the neutral point potential of the system. During normal operation, the operating voltage of the grounding electrode line is very low, merely representing the voltage drop across the conductor resistance and grounding electrode resistance caused by the grounding current, typically not exceeding several kilovolts. The grounding electrode is typically grounded through a resistor with a very small resistance value, usually less than 0.5Ω, indicating that when a fault occurs in the grounding electrode line, the signal amplitude generated by the fault itself is small. It is necessary to inject a pulse signal at the head end of the grounding electrode and analyze the response of the pulse signal at the fault point to achieve fault location. The probability of ground faults occurring in grounding electrode lines is high, and such faults can directly affect the bipolar system of HVDC transmission, significantly impacting the safe operation of the DC system.

At the current stage, higher requirements are placed on fault location of grounding electrode lines. Overcoming previous issues of grounding electrode line ranging errors and developing a traveling wave energy-based fault location device that can quickly determine the fault position along the line is of significant importance for ensuring the stable operation of high-voltage direct current (HVDC) systems. Current traditional fault location methods have problems such as large ranging errors caused by the influence of transition resistance and line length, as well as difficulties in calculating the setting value, rendering these methods no longer applicable.

To address this, the embodiments of the present invention provide a line fault detection method that involves injecting a pulse signal into the grounding electrode line, acquiring fault voltage traveling wave data based on the pulse signal response at the fault point in the grounding electrode line from the measurement end, and then determining the forward and reverse voltage traveling wave sequences of the entire grounding electrode line based on the fault voltage traveling wave data and a preset step size. Subsequently, the integral value sequences of the traveling wave products within the preset time period are determined based on the energy superposition expressions corresponding to the forward and reverse voltage traveling wave sequences. Finally, the fault distance in the grounding electrode line is determined based on the maximum mutation point in the integral value sequences. This method improves the accuracy of fault location in the grounding electrode line.

It should be understood that the specific embodiments described here are merely used to explain the present invention and are not intended to limit it.

The embodiments of the present invention provide a line fault detection method. Referring to FIG. 1, which is a flowchart of the first embodiment of a line fault detection method of the present invention.

The line fault detection method in this embodiment includes the following steps:

Step S10: Inject a pulse signal into the grounding electrode line and acquire the fault voltage traveling wave data responding to the fault point in the grounding electrode line based on the measurement end.

Figure 6:
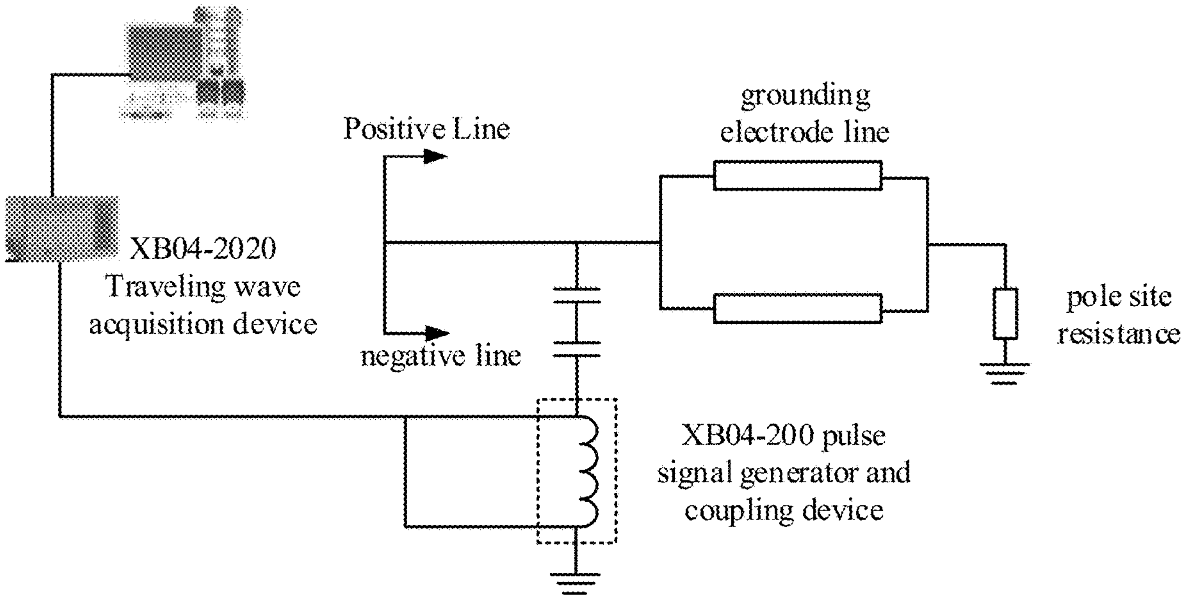
FIG. 6 is a reference diagram of the wiring method of the grounding electrode line in the first embodiment of the present invention.

In this embodiment, the positive and negative poles of the HVDC transmission line system have symmetrical parameters, and during normal operation, the grounding electrode line in the system is in a state of zero potential and zero current. Referring to FIG. 6, the grounding electrode line is connected to a signal generator and a fault traveling wave device. The signal generator can inject a pulse signal into the grounding electrode line, and the fault traveling wave acquisition device can collect the fault traveling wave in the grounding electrode line. When a fault occurs in the grounding electrode line, a pulse signal is emitted from the signal generator at the measurement end of the grounding electrode line to the fault point. The pulse signal undergoes refraction and reflection responses when reaching the fault point of the grounding electrode line. Based on the response of the pulse signal at the fault point, fault voltage traveling wave data can be measured at the measurement end.

When utilizing a signal generator to inject a pulse signal into the grounding electrode line, an appropriate signal generator is selected to ensure that the output pulse signal has sufficient amplitude and frequency range to effectively inject into the grounding electrode line. After setting parameters such as the amplitude, duration, and repetition frequency of the pulse signal, the pulse signal is injected into the grounding electrode line through the signal generator. The trigger method and injection time of the signal generator can be controlled according to actual needs to ensure that the injected pulse signal can propagate completely to the fault point. The fault traveling wave acquisition device (such as a high-speed digital wave recorder) set at the measurement end can measure the fault voltage traveling wave data, ensuring that the measurement end can accurately record the voltage traveling wave signal generated during the propagation of the pulse signal in the grounding electrode line.

It is worth noting that in a normally operating HVDC transmission system, current traveling waves cannot be directly obtained from current transformers. Generally, a voltage capacitor absorber needs to be installed on the grounding electrode bus, and a current transformer is added to this branch to obtain the current traveling wave. The fault voltage traveling wave, on the other hand, needs to be calculated based on the current traveling wave and the line parameters of the grounding electrode line.

In this embodiment, by emitting a pulse signal to the grounding electrode line using a signal generation device and collecting the fault voltage traveling wave data responding to the fault point, it facilitates subsequent analysis to determine the distance to the fault point. Furthermore, for fault location in the grounding electrode line of the HVDC transmission system, only the fault voltage signal needs to be collected at the measurement end of the grounding electrode line, eliminating the issue of data synchronization and simplifying the data processing flow.

Step S20: Based on the fault voltage traveling wave data and a preset step size, determine the voltage forward traveling wave sequence and voltage reverse traveling wave sequence for the entire grounding electrode line.

Figure 2:
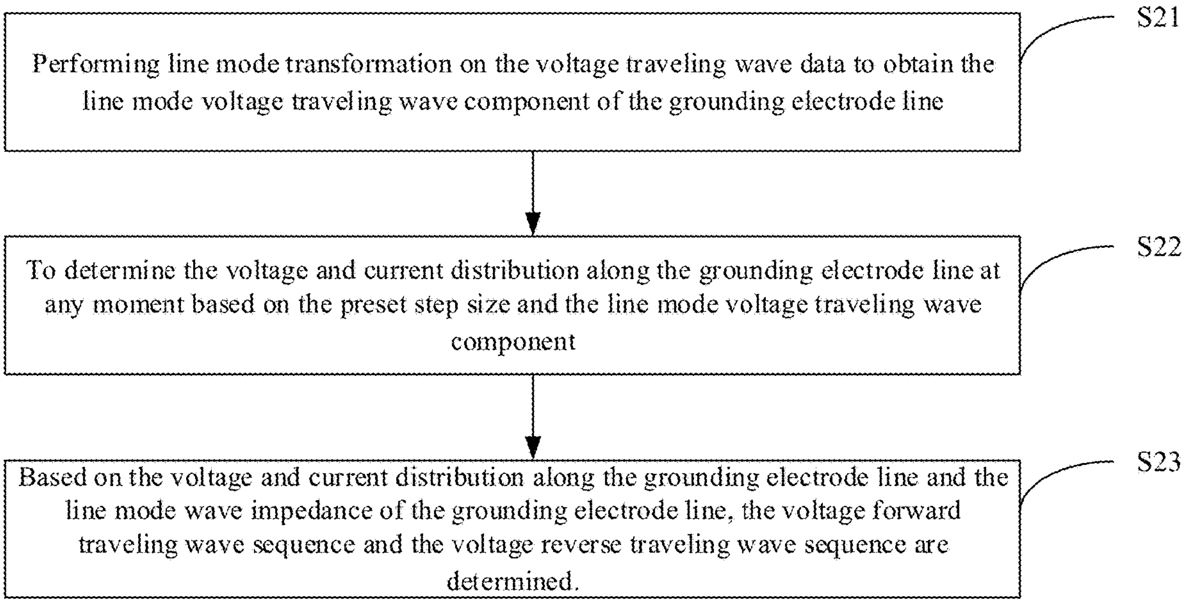
FIG. 2 is a detailed flowchart of step S20 in FIG. 1.

Specifically, referring to FIG. 2, in this embodiment, the step of determining the voltage forward traveling wave sequence and voltage reverse traveling wave sequence for the entire grounding electrode line based on the fault voltage traveling wave data and the preset step size includes:

Step S21: Perform line mode transformation on the voltage traveling wave data to obtain the line mode voltage traveling wave component of the grounding electrode line.

Step S22: Based on the preset step size and the line mode voltage traveling wave component, determine the voltage and current distribution along the grounding electrode line at any given time.

Step S23: Determine the voltage forward traveling wave sequence and the voltage reverse traveling wave sequence according to the voltage and current distribution and the line mode wave impedance of the grounding electrode line.

In this embodiment, the preset step size represents the incremental distance from the sampling point to the measurement end in each iteration. In the process of calculating the voltage forward traveling wave sequence and voltage reverse traveling wave sequence for the entire grounding electrode line using the fault traveling wave data and the preset step size, it is necessary to first decompose the fault voltage traveling wave signal using line mode transformation to extract the line mode voltage traveling wave component of the grounding electrode line. The reason for doing this is that in an actual operating grounding electrode line, there exists electromagnetic coupling between the double-circuit lines, and the two circuits are not independent of each other during normal operation. To eliminate the impact of coupling between the double-circuit grounding electrode lines and achieve an operation mode similar to a single grounding electrode line, the following formula is used to process the fault voltage traveling wave data:

$$\begin{bmatrix} u_1 \\ u_0 \end{bmatrix} = \frac{\sqrt{2}}{2}\begin{bmatrix} 1 & -1 \\ 1 & 1 \end{bmatrix}\begin{bmatrix} u_a \\ u_b \end{bmatrix}$$

Where, $u_a$ and $u_b$ represent the voltages of the two poles of the grounding electrode; $u_1$ and $u_0$ represent the line mode voltage and zero mode voltage respectively. Through the processing of the above equations, the line mode voltage traveling wave component is extracted to ensure the accuracy of fault location.

To further elaborate, the Bergeron transmission equation is used to solve for the voltage and current distribution at any given time. Based on the characteristics of the grounding electrode line, voltage traveling wave signals are extracted from the measurement end at a preset step size q, and the voltage and current values at each extraction point are recorded. Using the solution results of the following Bergeron transmission equation, the voltage and current distribution at any given time at the extraction points can be calculated:

$$u_{\lambda q,s}(\lambda q, t) = \frac{1}{2}\left(\frac{Z_{c,s}+r_s\lambda q/4}{Z_{c,s}}\right)^2 u_{M,s}(t+\lambda q/v_s) + \frac{1}{2}\left(\frac{Z_{c,s}-r_s\lambda q/4}{Z_{c,s}}\right)^2 u_{M,s}(t-\lambda q/v_s) - \left(\frac{r_s\lambda q/4}{Z_{c,s}}\right)^2 u_{M,s}(t) - r_s\lambda q/4\left(\frac{Z_{c,s}+r_s\lambda q/4}{Z_{c,s}}\right)\left(\frac{Z_{c,s}-r_s\lambda q/4}{Z_{c,s}}\right) i_{M,s}(t) \quad (1)$$

$$i_{\lambda q,s}(\lambda q, t) = \frac{1}{2Z_{c,s}}\left(\frac{Z_{c,s}+r_s\lambda q/4}{Z_{c,s}}\right) u_{M,s}(t+\lambda q/v_s) - \frac{1}{2Z_{c,s}}\left(\frac{Z_{c,s}-r_s\lambda q/4}{Z_{c,s}}\right) u_{M,s}(t-\lambda q/v_s) - \frac{1}{2Z_{c,s}}\cdot\frac{r_s\lambda q}{2Z_{c,s}}\left[u_{M,s}(t) - i_{M,s}(t)(r_s\lambda q/4)\right] \quad (2)$$

In this context, Expression (1) refers to the voltage distribution, while Expression (2) represents the current distribution. In these expressions, $Z_{c,s}$ denotes the line mode wave impedance, t represents the sampling time, λq stands for the distance from the sampling point with step size q to the measurement end, λ=1, 2, 3 . . . l/q; $v_s$ is the velocity of the line mode wave, $r_s$ represents the line mode resistance per unit length, $u_{M,s}$ indicates the voltage measured at the measurement end at a specific time, and $i_{M,s}$ represents the current measured at the measurement end at a specific time.

Furthermore, by utilizing the voltage and current distributions along the grounding electrode line from the measurement end, it is possible to calculate the directional traveling wave sequence of the voltage line mode traveling wave components along the line. Initially, the product of the forward and reverse voltage traveling waves distributed along the line is integrated within the observation time window. To achieve this, the directional traveling wave decomposition is performed based on the voltage traveling waves and wave impedance along the line, following the following expression to obtain the directional traveling wave distribution along the line:

$$u^+_{\lambda q,s} = (u_{\lambda q,s} + i_{\lambda q,s} z_{c,s})/2 \quad (3)$$

$$u^-_{\lambda q,s} = (u_{\lambda q,s} - i_{\lambda q,s} z_{c,s})/2 \quad (4)$$

Wherein, Expression (3) refers to the voltage forward traveling wave sequence, and Expression (4) refers to the voltage backward traveling wave sequence. By obtaining the voltage directional sequence along the grounding electrode line through these expressions, the effectiveness of representing the fault location on the line based on the sudden change in traveling wave energy along the line can be enhanced.

In this embodiment, by amplifying the electrical signals at the fault point sufficiently, the impact of interference points on the grounding electrode line fault distance measurement can be effectively eliminated, facilitating a more precise determination of the fault distance in subsequent steps.

Step S30: Based on the energy superposition expressions corresponding to the voltage forward traveling wave sequence and the voltage backward traveling wave sequence, determine the sequence of integral values of the product of traveling waves within a preset time period.

In this embodiment, it is necessary to first characterize and highlight the changes between each data point of the voltage forward traveling wave and the voltage backward traveling wave. This is achieved by calculating the numerical change gradient of the forward and backward traveling waves separately using the following expressions:

$$c^+_{dif-u}(k) = u^+_{\lambda q,s}(k) - u^+_{\lambda q,s}(k-1) \quad (5)$$

$$c^-_{dif-u}(k) = u^-_{\lambda q,s}(k) - u^-_{\lambda q,s}(k-1) \quad (6)$$

Expression (5) represents the numerical change gradient of the voltage forward traveling wave, while Expression (6) represents the numerical change gradient of the voltage backward traveling wave. In these expressions, k represents a data point with a time interval of Δt, k>1; and u(k) represents the voltage value at data point k. These expressions are used to highlight the difference in voltage traveling wave changes between fault points and non-fault points, as well as to reduce the impact of interfering mutation points.

Furthermore, the numerical change gradients of the traveling waves along the line are raised to the nth power and then segmented for summation to construct energy accumulation expressions based on the time dimension for the forward voltage traveling wave and the reverse voltage traveling wave, respectively. Specifically, starting from the kth data value of the nth power of the forward voltage traveling wave change gradient $$c^+_{dif-u}$$

and the reverse voltage traveling wave change gradient $$c^-_{dif-u}$$

distributed along the line, a superposition value is calculated for every N nth power data values of the voltage change gradients.

$$h_u^+ = \sum_k^{N-1+k} [c_{dif-u}^+(k)]^n,\ k = 1, 2, 3, \ldots, m-N+1 \tag{7}$$

$$h_u^- = \sum_k^{N-1+k} [c_{dif-u}^-(k)]^n,\ k = 1, 2, 3, \ldots, m-N+1 \tag{8}$$

$$G_u^+ = [h_{1u}^+\ h_{2u}^+\ h_{3u}^+\ h_{4u}^+\ h_{5u}^+\ \ldots\ h_{(m-N+1)u}^+] \tag{9}$$

$$G_u^- = [h_{1u}^-\ h_{2u}^-\ h_{3u}^-\ h_{4u}^-\ h_{5u}^-\ \ldots\ h_{(m-N+1)u}^-] \tag{10}$$

$$R_u^+ = [G_{1u}^+\ G_{2u}^+\ G_{3u}^+\ G_{4u}^+\ G_{5u}^+\ \ldots\ G_{[l/q]u}^+]^T \tag{11}$$

$$R_u^- = [G_{1u}^-\ G_{2u}^-\ G_{3u}^-\ G_{4u}^-\ G_{5u}^-\ \ldots\ G_{[l/q]u}^-]^T \tag{12}$$

In the equations, m=(l$f_s$)/v l represents the total length of the line, v is the traveling wave velocity, $f_s$ is the sampling frequency, N is the number of samples of $$c_{dif-u}^+$$

(k) that are superimposed each time, n is the preset power of the voltage change gradient, k is the k-th sampling point, and q is the sampling step size in the distance dimension. Expression (7) with $$h_u^+$$

represents the forward voltage traveling wave energy accumulation expression (i.e., the initial forward voltage traveling wave energy accumulation expression) at a certain point and time on the line. Expression (8) with $$h_u^-$$

represents the reverse voltage traveling wave energy accumulation expression (i.e., the initial reverse voltage traveling wave energy accumulation expression) at a certain point and time on the line. Expression (9) with $$G_u^+$$

represents the forward voltage traveling wave energy accumulation expression at a certain point on the line but at different times. Expression (10) with $$G_u^-$$

represents the reverse voltage traveling wave energy accumulation expression at a certain point on the line but at different times. Expression (11) with $$R_u^+$$

represents the forward voltage traveling wave energy accumulation expression at different positions and different times. Expression (12) with $$R_u^-$$

represents the reverse voltage traveling wave energy accumulation expression at different positions and different times.

The product operation is performed between the forward traveling wave energy accumulation expression and the reverse traveling wave energy expression, and the integral is calculated within a specified time period. Then, the integral value is calculated in a loop across the entire line length. The discontinuous point of voltage traveling waves can be considered as a result of the superposition of forward voltage traveling waves and reverse voltage traveling waves. To represent the distribution of abrupt change points along the line, the product of forward voltage traveling waves and reverse voltage traveling waves is multiplied and then integrated within a preset interval to obtain the fault distance. Specifically, the product of the forward voltage traveling wave energy accumulation expression and the reverse voltage traveling wave energy accumulation expression is calculated. Subsequently, the integral value of the product across the entire line length is calculated according to the following expression:

$$f_{u-1}(\lambda q) = \int_{t_0}^{t_0+\frac{l}{2v}} R_u^+ R_u^- dt,\ \lambda q \in \left[0, \frac{l}{2}\right] \tag{13}$$

$$f_{u-2}(\lambda q) = \int_{t_0+\frac{l}{2v}}^{t_0+\frac{l}{v}} R_u^+ R_u^- dt,\ \lambda q \in \left[\frac{l}{2}, l\right] \tag{14}$$

In the formula, $t_0$ represents the initial sampling time, while [$t_0$, $t_0$+l/2v] and [$t_0$+l/2v, $t_0$+l/v] represent the upper and lower limits of the two sets of traveling wave observation time windows. The $f_{u-1}$ (λq) in expression (13) represents the integral value within the first half of the long line, and the $f_{u-2}$ (λq) in expression (14) represents the integral value within the second half of the long line.

Figure 3:
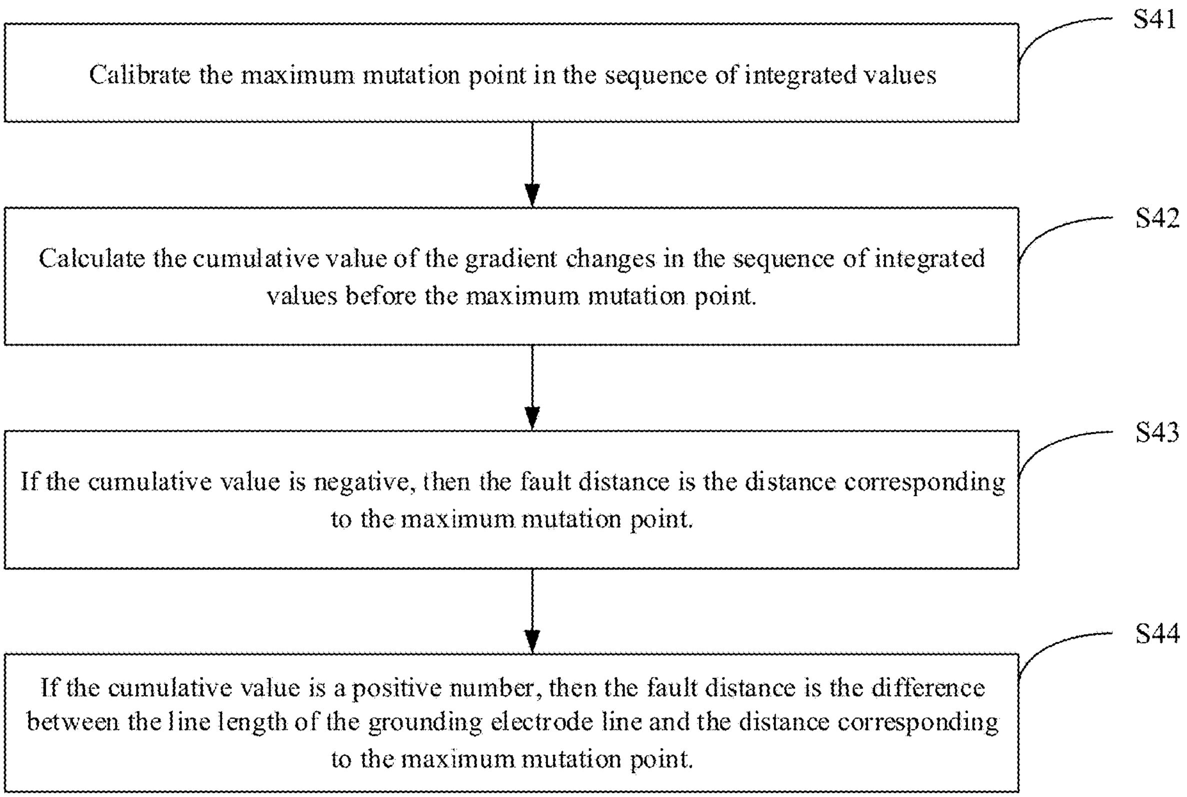
FIG. 3 is a detailed flowchart of step S40 in FIG. 1.

In this embodiment, step S40, determining the fault distance based on the maximum mutation point in the integral value sequence, comprises the following steps, referring to FIG. 3:

Step S41 involves identifying the maximum mutation point in the integral value sequence.

Step S42 calculates the superimposed value of the change gradient in the integral value sequence before the maximum mutation point.

Step S43, if the superimposed value is negative, the fault distance is determined as the distance corresponding to the maximum mutation point.

Step S44, if the superimposed value is positive, the fault distance is determined as the difference between the total length of the grounding electrode line and the distance corresponding to the maximum mutation point.

In this embodiment, it is necessary to map the integral values to the distance dimension, identify the maximum mutation point in the integral sequence, and calculate the cumulative value of the gradient change in the integral sequence before that mutation point. The fault distance is determined by considering the position of the maximum mutation point and the sign of the cumulative value. During the process of identifying the position of the maximum mutation point in the integral values, the rationale for this step is that when the grounding electrode line is operating normally, the voltage traveling waves calculated based on the line transmission equation vary continuously along the line, meaning the gradient of numerical changes in voltage direction traveling waves is small, and the corresponding integral values also change continuously. However, when a fault occurs in the grounding electrode line, the voltage traveling wave distribution calculated based on the line transmission equation becomes discontinuous, resulting in a maximum mutation point, which signifies a significant gradient of numerical changes in voltage direction traveling waves and a discontinuous distribution of corresponding integral values. Furthermore, to calculate the cumulative value of the gradient change in the integral sequence before the mutation point, the specific formula used (assuming the maximum mutation point is within the § interval) is:

$$b_{dif-f}^{u-1}(T) = f^{u-1}(T+1) - f^{u-1}(T) \quad (15)$$

$$b_{dif-f}^{u-2}(T) = f^{u-2}(T+1) - f^{u-2}(T) \quad (16)$$

$$z_u^{u-1} = \sum_{T=1}^{\xi} b_{dif-f}^{u-1}(T) \quad (17)$$

$$z_u^{u-2} = \sum_{T=1}^{\xi} b_{dif-f}^{u-2}(T) \quad (18)$$

Where, T represents the distance from the sampling point with step size q to the measurement end, $$b_{dif-f}^{u-1}(T)$$

is the gradient of integral value change in the first half of the long line, $$b_{dif-f}^{u-2}(T)$$

is the gradient of integral value change in the second half of the long line, $$z_u^{u-1}$$

is the cumulative value of the gradient of integral value change in the first half of the long line, and $$z_u^{u-2}$$

is the cumulative value of the gradient of integral value change in the second half of the long line.

Based on the above expressions, if the cumulative value is negative, the fault distance is the distance corresponding to the location of the maximum mutation point. If the cumulative value is positive, the fault distance is the total length of the grounding electrode line minus the distance corresponding to the location of the maximum mutation point. The implementation of this step is as follows: let the distance corresponding to the maximum mutation point be x. When x<½ (or x≥½), if $z_{u-1}$ (or $z_{u-2}$), the fault distance is x. If $z_{u-1}$ (or $z_{u-2}$) and is positive, the fault distance is (1−x), where/represents the total length of the grounding electrode line.

In this embodiment, the fault point distance is determined through the above method, which, compared to previous calculation methods, does not require setting a fixed value to judge the fault location and is not affected by the transition resistance or the length of the grounding electrode line, resulting in higher ranging accuracy.

Figure 7:
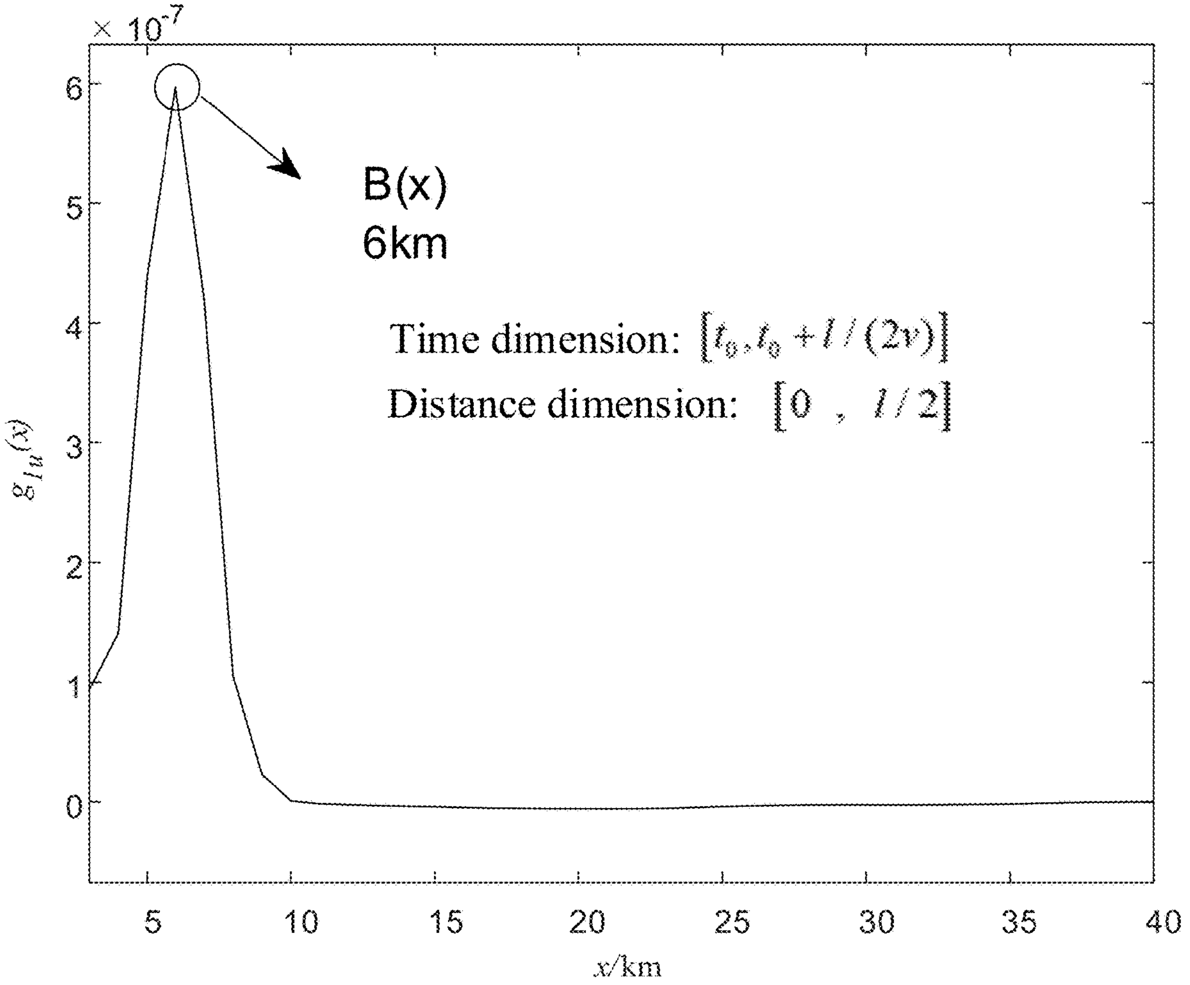
FIG. 7 is the result of the first ranging function in the example of the present invention.
Figure 8:
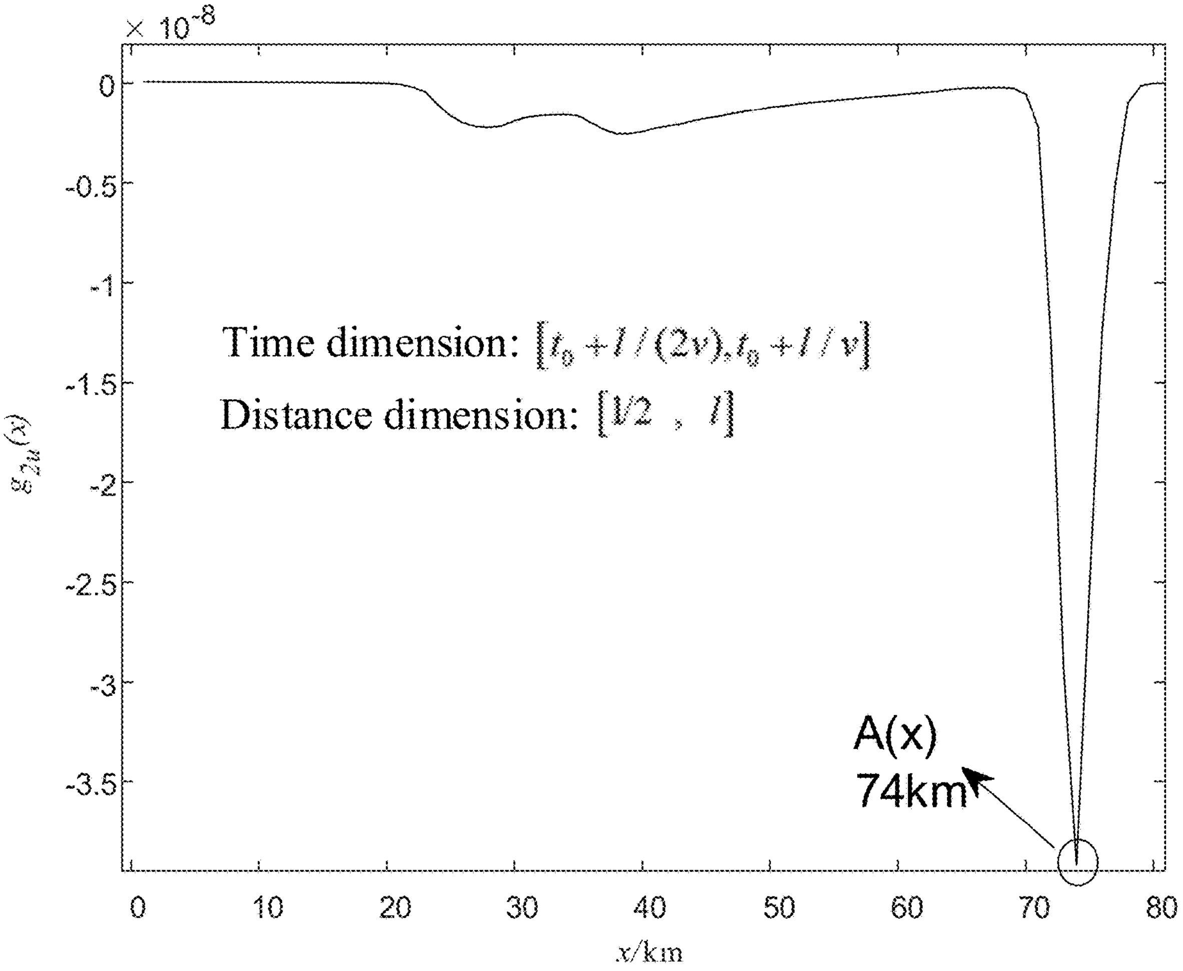
FIG. 8 is the result of the second ranging function in the example of the present invention.

To facilitate the understanding of the technical solution of the present invention, the following provides an explanation and description through a specific example:

Example: In a high-voltage direct current (HVDC) transmission system with a grounding electrode line, the total length of the line is 80 km. The grounding electrode line adopts a double-circuit overhead line on the same tower, and it is grounded through a resistance with a very small resistance value at the pole site, generally not exceeding 0.5Ω. The current fault type is a non-metallic grounding fault with a transition resistance of 1Ω and a sampling rate of 1 MHz. To determine the distance to the fault point, a pulse signal is first injected into the grounding electrode line using a signal generator. In this embodiment, the injected signal is a 100 kHz high-frequency sinusoidal signal with a pulse width of 16 us, a pulse interval of 1.1 ms, and a pulse amplitude of 48V. Based on the response of the pulse signal at the fault point, fault voltage traveling wave data is measured at the measurement end. The voltage and current distribution along the entire line within the protection coverage area of this end are calculated according to a preset step size. The voltage traveling wave signal is decomposed using line mode transformation to extract the line mode voltage traveling wave component of the grounding electrode line. Voltage traveling wave signals within the protection coverage area of this end are extracted at a preset step size q=100 m, and an energy superposition expression is obtained based on expressions (7)-(12). In this example, the total length of the line is 80 km, the traveling wave velocity v=298 km/ms, the sampling frequency=1 MHz, N is taken as 5, and n is taken as 3. The product operation is performed on the superimposed expressions of the forward and reverse traveling wave energies, and integrated within a specified time period. Then, the integral values are calculated in a loop along the entire line length. The product of the superimposed expression of the forward voltage traveling wave energy and the superimposed expression of the reverse voltage traveling wave energy is calculated. The integral values are mapped to the distance dimension, the maximum mutation point of the integral sequence is identified, and the cumulative value of the gradient changes in the integral sequence before that mutation point is calculated. The fault distance is determined by combining the position corresponding to the maximum mutation point and the sign of the cumulative value. In this example, the distribution results of the ranging function are shown in FIGS. 7 and 8, where the distance corresponding to the maximum mutation point in the first ranging function is 6 km, and the distance corresponding to the maximum mutation point in the second ranging function is 74 km. The cumulative value of the gradient changes in the integral sequence before the mutation point is calculated.

If the result of the cumulative value is negative, the fault distance is the distance corresponding to the position of the maximum mutation point. If the result of the cumulative value is positive, the fault distance is the full length of the grounding electrode line minus the distance corresponding to the position of the maximum mutation point. The implementation of this step is as follows: assuming the distance corresponding to the obtained maximum mutation point is x, when x<½ (orx≥½), if $z_{u-1}$ (or $z_{u-2}$) is negative, the fault distance is x; if $z_{u-1}$ (or $z_{u-2}$) is positive, the fault distance is 1−x. In this embodiment, the distance corresponding to the maximum mutation point of the first ranging function is less than 40 km, and a is positive, so the fault distance is judged to be 80-6-74 km; the distance corresponding to the maximum mutation point of the second ranging function is greater than 40 km, and b is negative, so the fault distance is judged to be 74 km.

Figure 4:
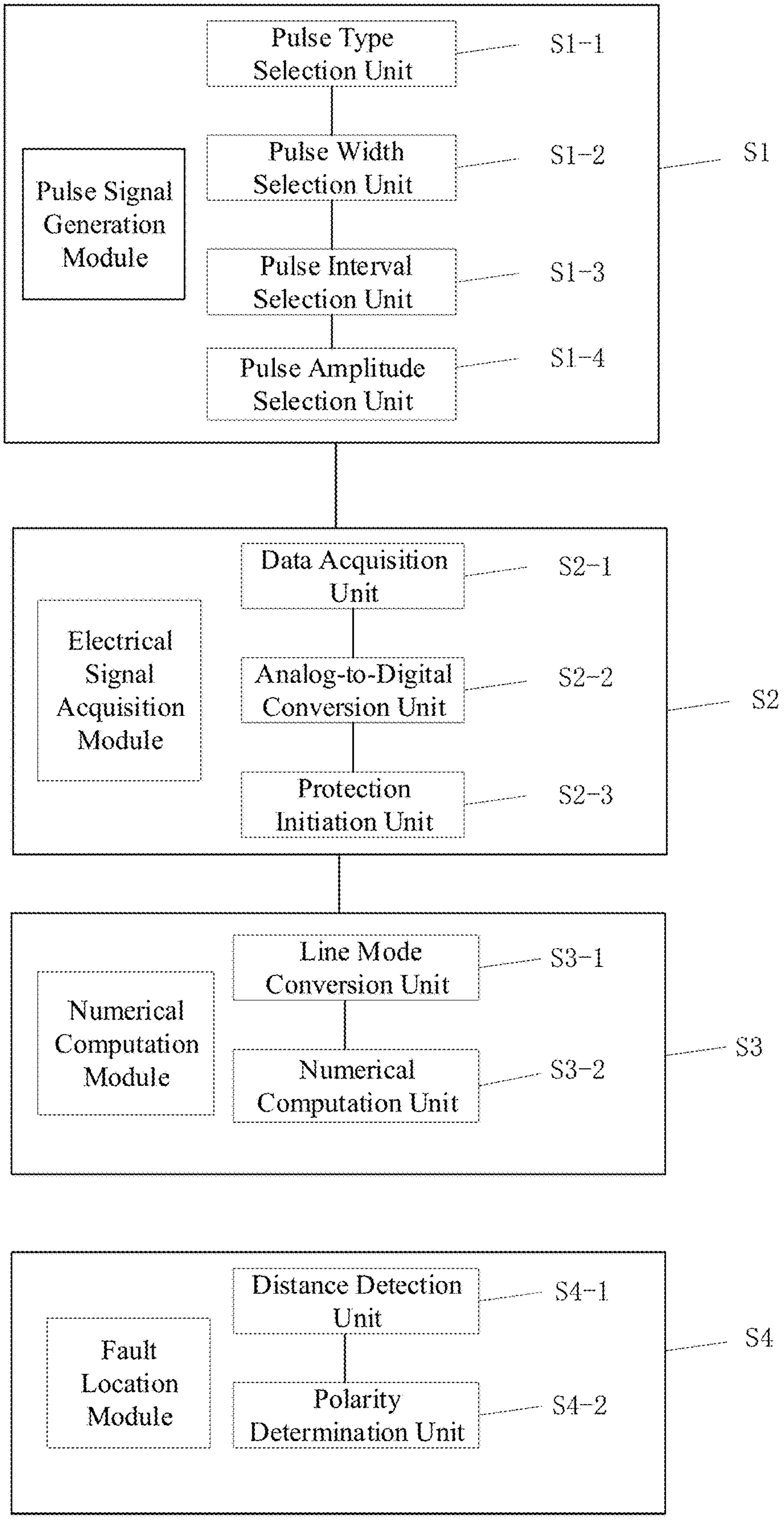
FIG. 4 is a schematic diagram of the functional modules involved in the second embodiment of the present invention.

Furthermore, referring to FIG. 4, the present invention provides a fault location system for grounding electrode lines based on the abrupt change of traveling wave energy along the line, which includes:

Module S1: Pulse Signal Generation Module, used to execute the steps of injecting a pulse signal into the grounding electrode line and acquiring fault voltage traveling wave data based on the response at the fault point in the grounding electrode line through the measurement end.

Within the grounding electrode line fault location system based on the abrupt change of traveling wave energy along the line, the pulse signal generation module further includes:

Module S1-1: Pulse Signal Type Selection Unit, responsible for selecting the type of injected pulse signal.

Module S1-2: Pulse Signal Width Selection Unit, responsible for selecting the width of the injected pulse signal.

Module S1-3: Pulse Signal Interval Selection Unit, responsible for selecting the interval of the injected pulse signal.

Module S1-4: Pulse Signal Amplitude Selection Unit, responsible for selecting the amplitude of the injected pulse signal.

Module S2: Electrical Signal Sequence Acquisition Module: Used to execute the step of determining the voltage forward traveling wave sequence and voltage reverse traveling wave sequence along the entire grounding electrode line based on the fault voltage traveling wave data and preset step size.

Within the electrical signal acquisition module of the grounding electrode line fault location system based on the abrupt change of traveling wave energy along the line, it includes:

Module S2-1: Data Acquisition Unit, responsible for collecting analog signals output from the transformer installed at the measurement end.

Module S2-2: Analog-to-Digital Conversion Unit, used to convert the collected analog signals into digital signals.

Module S2-3: Protection Activation Unit, designed to compare the collected digital signals with the set protection activation threshold. If the digital signal exceeds the protection activation threshold, it will read and store the data.

Module S3: Numerical Calculation Module: Used to execute the step of determining the integral value sequence of the traveling wave product within a preset time period based on the energy superposition expressions corresponding to the voltage forward traveling wave sequence and the voltage reverse traveling wave sequence.

Within the numerical calculation module of the grounding electrode line fault location system based on the abrupt change of traveling wave energy along the line, it includes:

Module S3-1: Line Mode Conversion Unit, responsible for decomposing the traveling wave of the grounding electrode line to obtain the line mode traveling wave.

Module S3-2: Numerical Calculation Unit, used to perform multiplication operations on the superimposed values of the numerical change gradients in two directions and conduct integration operations within a specified line length interval.

Module S4: Fault Location Module: Used to execute the step of determining the fault distance based on the maximum mutation point in the integral value sequence.

Within the grounding electrode line fault location system based on the abrupt change of traveling wave energy along the line, the fault location module includes:

Module S4-1: Distance Detection Unit, responsible for measuring the distance corresponding to the maximum mutation point in the integral sequence.

Module S4-2: Polarity Determination Unit, used to determine the polarity of the maximum mutation point in the integral sequence.

Figure 5:
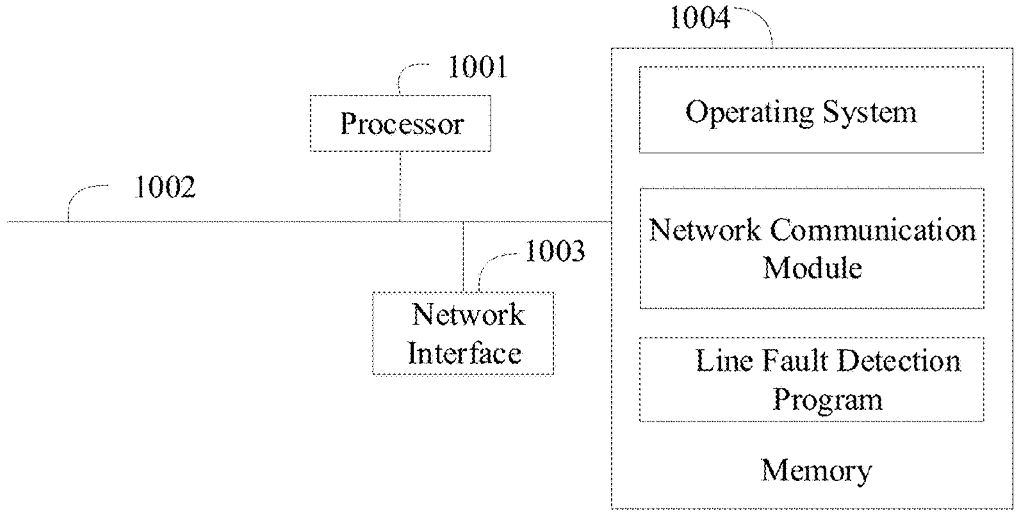
FIG. 5 is a schematic diagram of the terminal structure of the hardware operating environment involved in the embodiment of the present invention.

Referring to FIG. 5, FIG. 5 is a schematic diagram of the hardware operation environment of the line fault detection equipment involved in the embodiment of the present invention.

As shown in FIG. 5, the line fault detection device may include a processor 1001, such as a Central Processing Unit (CPU), a communication bus 1002, a network interface 1003, and a memory 1004. Among them, the communication bus 1002 is used to achieve connection communication between these components, and the network interface 1003 may optionally include a standard wired interface or a wireless interface (such as a Wireless-Fidelity (WI-FI) interface). The memory 1004 can be a high-speed Random Access Memory (RAM) or a stable Non-Volatile Memory (NVM), such as a disk memory. Optionally, the memory 1004 can also be a storage device independent of the aforementioned processor 1001.

It is understood by those skilled in the art that the structure shown in FIG. 5 does not constitute a limitation on the line fault detection device. It can include more or fewer components than illustrated, or combine certain components, or have a different component layout.

As shown in FIG. 5, the memory 1004, which serves as a storage medium, can include an operating system, a data storage module, a network communication module, a user interface module, and a routing announcement program.

In the line fault detection device shown in FIG. 5, the network interface 1003 is primarily used for data communication with other devices. The processor 1001 and memory 1004 in the line fault detection device of the present invention can be set up within the line fault detection device. The line fault detection device utilizes the processor 1001 to call the line fault detection program stored in the memory 1004 and execute the steps of the line fault detection method.

It should be noted that the terms "include", "contain", or any other variants thereof, are intended to cover non-exclusive inclusions in this context, such that a process, method, article, or system that comprises a list of elements does not include only those elements but may include other elements not expressly listed or inherent to such process, method, article, or system. In the absence of further limitations, elements defined by the statement "including a . . . " do not exclude the presence of additional identical elements in the process, method, article, or system that includes the element.

The serial numbers of the embodiments of the invention described above are merely for description purposes and do not represent the superiority or inferiority of the embodiments.

Through the description of the above embodiments, technical personnel in the field can clearly understand that the methods of the embodiments can be implemented by means of software plus necessary general hardware platforms, or can also be implemented through hardware, but in many cases, the former is a preferred embodiment. Based on this understanding, the technical solution of the invention, essentially or in terms of contributions to the existing technology, can be embodied in the form of a software product. The computer software product is stored in a storage medium (such as ROM/RAM) as described above and includes several instructions for enabling a terminal device (which can be a network device, etc.) to execute the methods described in various embodiments of the invention.

The above is only the preferred embodiment of the invention, and does not limit the scope of the invention. Any equivalent structure or equivalent process transformation made using the content of the specification and drawings of the invention, or the direct or indirect application in other related technical fields, is similarly included in the scope of patent protection of the invention.

What is claimed is:

1. A line fault detection method, comprising:

injecting a pulse signal into a grounding electrode line and acquiring fault voltage traveling wave data responding to a fault point in the grounding electrode line based on a measuring spot;

based on the fault voltage traveling wave data and a preset step size, determining a voltage forward traveling wave sequence and a voltage reverse traveling wave sequence for the grounding electrode line;

based on corresponding energy superposition expressions of the voltage forward traveling wave sequence and the voltage reverse traveling wave sequence, determining an integral value sequence of a traveling wave product within a preset time period; and based on a maximum mutation point in the integral value sequence, determining a fault distance;

wherein steps of determining the voltage forward traveling wave sequence and the voltage reverse traveling wave sequence for the grounding electrode line based on the fault voltage traveling wave data and the preset step size comprises:

performing a line mode transformation on the fault voltage traveling wave data to obtain line mode voltage traveling wave components of the grounding electrode line;

based on the preset step size and the line mode voltage traveling wave components, determining voltage and current distribution along the grounding electrode line at any given moment; and based on the voltage and current distribution as well as line mode wave impedance of the grounding electrode line, determining the voltage forward traveling wave sequence and the voltage reverse traveling wave sequence;

wherein steps of determining the integral value sequence of the traveling wave product within the preset time period based on the corresponding energy superposition expressions of the voltage forward traveling wave sequence and the voltage reverse traveling wave sequence comprise:

obtaining a first numerical change gradient corresponding to the voltage forward traveling wave sequence and a second numerical change gradient corresponding to the voltage reverse traveling wave sequence;

based on the first numerical change gradient, the second numerical change gradient, a traveling wave velocity, a line length of the grounding electrode line, a sampling frequency, and the preset step size, determining a forward voltage traveling wave energy superposition expression and a reverse voltage traveling wave energy superposition expression, respectively;

multiplying the forward voltage traveling wave energy superposition expression and the reverse voltage traveling wave energy superposition expression to determine an integral value for the preset time period within the grounding electrode line; and mapping integral values to a distance dimension to obtain the integral value sequence;

before steps of obtaining the first numerical change gradient corresponding to the voltage forward traveling wave sequence and the second numerical change gradient corresponding to the voltage reverse traveling wave sequence, the line fault detection method comprises:

based on a preset time interval, the voltage forward traveling wave sequence, and the voltage reverse traveling wave sequence, calculating the first and second numerical change gradients corresponding to the voltage forward traveling wave sequence and the voltage reverse traveling wave sequence, respectively;

wherein steps of determining the forward voltage traveling wave energy superposition expression and the reverse voltage traveling wave energy superposition expression based on the first numerical change gradient, the second numerical change gradient, the traveling wave velocity, the line length of the grounding electrode line, the sampling frequency, and the preset step size comprise:

based on the first numerical change gradient, the second numerical change gradient, the traveling wave velocity, the line length of the grounding electrode line, the sampling frequency, and the preset step size, determining an initial forward voltage traveling wave energy superposition expression corresponding to the first numerical change gradient and an initial reverse voltage traveling wave energy superposition expression corresponding to the second numerical change gradient; and based on the initial forward voltage traveling wave energy superposition expression and the initial reverse voltage traveling wave energy superposition expression, determining the forward voltage traveling wave energy superposition expression and the reverse voltage traveling wave energy superposition expression, respectively;

wherein the initial forward voltage traveling wave energy superposition expression represents superposition expression of forward voltage traveling wave energy at any point and any time in the grounding electrode line, and the initial reverse voltage traveling wave energy superposition expression represents superposition expression of reverse voltage traveling wave energy at any point and any time in the grounding electrode line;

wherein steps of determining the fault distance based on the maximum mutation point in the integral value sequence comprises:

marking the maximum mutation point in the integral value sequence;

calculating a superimposed value of a gradient of change in the integral value sequence before the maximum mutation point;

when the superimposed value is negative, determining that the fault distance is a distance corresponding to the maximum mutation point;

when the superimposed value is positive, determining that the fault distance is a difference between the line length of the grounding electrode line and a distance corresponding to the maximum mutation point; and wherein the fault distance is determined exclusively based on the maximum mutation point and the superimposed value of the gradient of change in the integral value sequence before the maximum mutation point, without requiring an identification of a second mutation point from a different observation time window.

2. A system for implementing the line fault detection method according to claim 1, comprising:

a pulse signal generation module, configured to perform a step of injecting the pulse signal into the grounding electrode line and acquiring the fault voltage traveling wave data in response to the fault point in the grounding electrode line based on the measuring spot;

an electrical signal sequence acquisition module, configured to perform the steps of determining the voltage forward traveling wave sequence and the voltage reverse traveling wave sequence for the grounding electrode line based on the fault voltage traveling wave data and the preset step size;

a numerical calculation module, configured to perform the steps of determining the integral value sequence of the traveling wave product within the preset time period based on the corresponding energy superposition expressions of the voltage forward traveling wave sequence and the voltage reverse traveling wave sequence; and a fault distance measurement module, configured to perform the steps of determining the fault distance based on the maximum mutation point in the integral value sequence.

3. A line fault detection device, comprising a memory, a processor, and a line fault detection program stored on the memory and operable on the processor, wherein the line fault detection program is configured to implement the line fault detection method according to claim 1.

4. A non-transitory computer-readable storage medium, comprising a line fault detection program stored on the non-transitory computer-readable storage medium; when the line fault detection program is executed by a processor, the line fault detection method according to claim 1 is realized.

* * * * *